(12) United States Patent
Flükiger et al.

(10) Patent No.: US 7,887,644 B2
(45) Date of Patent: Feb. 15, 2011

(54) SUPERCONDUCTIVE ELEMENTS CONTAINING COPPER INCLUSIONS, AND A COMPOSITE AND A METHOD FOR THEIR PRODUCTION

(75) Inventors: René Flükiger, Plan-les-Quates (CH); Daniel Eckert, Bachenbülach (CH)

(73) Assignee: Bruker Biospin AG, Ch-Faellanden (CH)

( * ) Notice: Subject to any disclaimer, the term of this patent is extended or adjusted under 35 U.S.C. 154(b) by 695 days.

(21) Appl. No.: 11/482,949

(22) Filed: Jul. 10, 2006

(65) Prior Publication Data

US 2007/0021306 A1 Jan. 25, 2007

(30) Foreign Application Priority Data

Jul. 19, 2005 (EP) .................. 05015585

(51) Int. Cl.
H01L 39/24 (2006.01)
H01B 12/00 (2006.01)

(52) U.S. Cl. ......................... 148/98; 505/230

(58) Field of Classification Search .................. 148/98; 29/599; 505/230

See application file for complete search history.

(56) References Cited

U.S. PATENT DOCUMENTS

| | | | |
|---|---|---|---|
| 3,509,622 A | 5/1970 | Bernert | |
| 3,958,327 A | 5/1976 | Marancik | |
| 4,611,390 A | 9/1986 | Tanaka | |
| 4,629,515 A * | 12/1986 | Imaizumi et al. ............... | 419/3 |
| 4,746,581 A | 5/1988 | Fluekiger | |
| 5,374,320 A * | 12/1994 | Matsumoto et al. ......... | 148/421 |
| 6,836,955 B2 * | 1/2005 | Wong ............................ | 29/599 |
| 6,849,137 B2 * | 2/2005 | Iwaki et al. .................... | 148/98 |
| 7,505,800 B2 * | 3/2009 | Flukiger et al. .............. | 505/232 |

FOREIGN PATENT DOCUMENTS

| | | |
|---|---|---|
| EP | 0 440 799 | 8/1991 |
| GB | 1 543 149 | 3/1979 |

OTHER PUBLICATIONS

M.K. Rudziak et al. "Development of a Nb3Sn conductor containing Ga and Mg dopants", IEEE Transactions on Applied Superconductivity IEEE USA, vol. 11, No. 1, Mar. 2001, pp. 3580-3583.

M. Field et al. "Progress with Nb3Sn conductors at oxford instruments, superconducting technology", IEEE Transactions on Applied Superconductivity IEEE USA, vol. 11, No. 1, Mar. 2001, pp. 3692-3695.

(Continued)

Primary Examiner—Roy King
Assistant Examiner—Jie Yang
(74) Attorney, Agent, or Firm—Paul Vincent

(57) ABSTRACT

The invention relates to a composite (1), comprising a Cu—Sn bronze matrix (2) and filaments (3) surrounded by the bronze matrix (2), wherein the filaments (3) contain niobium (=Nb) or a Nb alloy, characterized in that the filaments (3) contain between 0.3% and 20% of volume of copper (=Cu) substructures (4), which are distributed within the Nb or the Nb alloy. The composite can be used to produce a superconducting element with the bronze route which has an improved critical current density.

16 Claims, 4 Drawing Sheets state of the art

OTHER PUBLICATIONS

K. De Moranville et al. "Development of a niobium-tin multifilamentary wire with artificial tantalum inclusions", IEEE Transactions on Applied Superconductivity USA, vol. 3, No. 1, Mar. 1993, pp. 982-985.

V. Abaeckerli et al. "Influence of the Ti doping method on the high field performance of $(Nb,Ta,Ti)_3Sn$ multifilamentary wires using Osprey bronze", Paper 4MRO4, Submitted to ASC 2004, Jacksonville FL, USA.

D. Rodrigues et al. "Properties, Flux Pinning and Application of Cu-NB Superconductors with Nanometric-Scale Pinning Centers" Presented at the Applied Superconductivity Conference 2004 (ASC2004), Jacksonville, FL, USA.

* cited by examiner state of the art state of the art

SUPERCONDUCTIVE ELEMENTS CONTAINING COPPER INCLUSIONS, AND A COMPOSITE AND A METHOD FOR THEIR PRODUCTION

This application claims Paris Convention priority of EP 05 015 585.2 filed on Jul. 19, 2005 the entire disclosure of which is hereby incorporated by reference.

BACKGROUND OF THE INVENTION

The invention relates to a composite, comprising a Cu—Sn bronze matrix and filaments surrounded by the bronze matrix, wherein the filaments contain niobium (=Nb) or a Nb alloy. The invention further relates to a method for producing a superconductive element. The invention moreover relates to a superconductive element, in particular a multifilament wire, produced by the bronze route based on the bronze diffusion process, comprising filaments containing $Nb_3Sn$.

Such composites, superconductive elements and methods for the production thereof are e.g. described in V. Abächerli et al., ASC 2004, Jacksonville (Fla.), Paper 4MR04, where the bronze route to $Nb_3Sn$ is described.

$Nb_3Sn$ is one of the few commercially relevant superconducting materials. It is used in particular for the production of high field magnetic coil systems.

There are basically three ways to produce $Nb_3Sn$: the powder in tube (=PIT) process, the internal tin diffusion (=ISD) method, and the bronze route. The bronze route is of particular relevance in the production of magnetic coil systems.

The basic idea of the bronze route is to introduce Nb containing filaments into a Cu—Sn bronze matrix. Several (re-)bundling and elongating steps are usually applied. During a final annealing of this composite at typically 600-730° C., Sn from the bronze matrix diffuses into the Nb containing filaments and forms $Nb_3Sn$. The Nb containing filaments are mostly dissolved.

Compared to $Nb_3Sn$ material made by PIT or ISD, $Nb_3Sn$ wires made by the bronze route have relatively low critical current densities jc at given temperature values (of about 4 K) and magnetic field strengths (of about 15 T) relevant for superconducting magnetic coil systems. This means that the maximum magnetic field strength obtainable with bronze route wires is relatively low.

It is therefore the object of the invention to provide a composite from which a superconductive element which has an improved, i.e. higher critical current density $j_c$ can be produced by the bronze route. Moreover, it is the object of the invention to provide a corresponding method of production for such a superconductive element, and to provide such a superconductive element itself.

SUMMARY OF THE INVENTION

As far as the composite is concerned, this object is achieved, in accordance with the invention, by a composite as introduced in the beginning, characterized in that the filaments contain between 0.3% and 20% of volume of copper (=Cu) substructures, which are distributed within the Nb or the Nb alloy.

The inventive composite is intended for use, in accordance with the invention, for producing a superconductive element. By introducing Cu substructures into the Nb containing filaments, during the solid state reaction of Nb to $Nb_3Sn$, it is possible that Cu accumulates at grain boundaries of the $Nb_3Sn$ material. At concentrations not too high, Cu has a positive effect on the critical current density jc of the $Nb_3Sn$ material. This effect is due to higher pinning forces at the grain boundaries. In the bronze route as known from the state of the art, the only Cu source is the bronze matrix surrounding Nb containing filaments. Once a small layer of $Nb_3Sn$ has been formed on the surface of the Nb containing filaments, Cu may no more arrive at $Nb_3Sn$ forming deeper within the filament, since Cu is practically insoluble in $Nb_3Sn$. This limits the jc value in the bronze route material as known from the state of the art. With the invention, Cu is introduced into and distributed within the Nb filament before the formation of $Nb_3Sn$. This means that the amount of Cu within the $Nb_3Sn$ material to be formed can be controlled directly, and the diffusion barrier of freshly formed $Nb_3Sn$ on the filament during annealing is irrelevant for the Cu content. As a result, the inventive composite allows choosing a desired amount of Cu within a $Nb_3Sn$ superconducting element made from said composite by the bronze route, and thus obtaining an optimised critical current density jc of the superconductive element is possible.

In an advantageous embodiment of the inventive composite, the filaments contain less than 10% of volume of Cu substructures, in particular about 1% of volume of Cu substructures. In this case, the supercoducting element that can be produced from the composite can attain a high volume fraction of superconducting material. At Cu contents too large, the volume fraction of superconducting phase decreases considerably, making the resulting superconductive element less effective.

In another preferred embodiment, the Cu substructures contain elemental copper, in particular wherein the Cu substructures consist of elemental copper with a purity of at least 98% of volume, preferably with a purity of at least 99.8% of volume. High purity of the Cu makes it more likely to arrive at the grain boundary of $Nb_3Sn$, since possibly immobile intermetallic phases containing Cu are less likely to form.

Further preferred is an embodiment of the inventive composite, wherein the filaments contain at least 70% of volume of Nb or Nb alloy, in particular at least 90% of volume of Nb or Nb alloy, preferably about 98% of volume of Nb or Nb alloy. Note that in accordance with the invention, the filaments may contain metallic Nb and/or a Nb alloy and/or several Nb alloys.

Particularly preferred is an embodiment characterized in that the filaments are directly embedded within the bronze matrix. This keeps diffusion paths for Sn short.

In an alternative embodiment of the inventive composite, the filaments or groups of filaments are contained within a copper shell or a copper shell for each group of filaments, and that the copper shell(s) are situated within the bronze matrix.

In an advantageous embodiment, the Cu substructures are evenly distributed within the Nb or the Nb alloy, in particular wherein the Cu substructures are powder particles distributed within Nb or Nb alloy powder particles. This allows an even distribution of Cu within the Nb containing filaments.

Alternatively, in a highly preferred embodiment, the Cu substructures comprise Cu threads. Cu threads may be introduced into the filaments by standard procedures such as elongation of Cu rods mixed with Nb containing rods. Preferably, the in cross-section, the Cu threads are evenly distributed over the filament. It is further preferred when the Cu threads are in parallel to each other.

In a further development of said embodiment, the Cu threads have a diameter between 1 nm and 200 nm, preferably between 5 nm and 100 nm, most preferably about 20 to 50 nm. At such sizes, diffusion processes are quickly completed.

An embodiment of the inventive composite also preferred is characterized in that the filaments have a diameter between 1 μm and 10 μm, in particular between 2 μm and 6 μm, preferably about 5 μm. Again, at such sizes, diffusion processes are quickly completed.

A particularly preferred embodiment of the inventive composite is characterized in that the Nb or Nb alloy containing filaments have the shape of elongated hollow pipes, in particular with an inner diameter size of 2 to 15 μm and an outer diameter size of 6 to 25 μm, wherein the inner surface of the hollow pipes is in close contact with an inner bronze core and the outer surface of the hollow pipes is in close contact with the surrounding bronze matrix. This facilitates and accelerates a complete reaction of the available Nb by shortening diffusion paths.

In a further development of this embodiment, the inner bronze core contains a core of Ta or a Ta alloy. Ta increases the $B_{c2}$ value of the $Nb_3Sn$ phase to be produced.

In a preferred embodiment of the inventive composite, the Cu—Sn bronze contains between 15 and 24 wt. % Sn. The high Sn content accelerates the Sn diffusion.

Within the scope of the present invention is also a method for producing a superconductive element, in particular a multifilament wire, starting from an inventive composite as described above, whereby in a first step the composite is extruded at a temperature between 300° C. and 750° C., followed by cold or hot working and annealing steps in which the composite is elongated in parallel to the filaments and softened by temperature treatment, followed by a stacking step, in which a multitude of elongated composites from the preceding cold or hot working steps are bundled, the steps of extruding, elongating, annealing and stacking being repeated one or more times, followed by a final elongating process, including intermediate annealing processes, in which the composite is elongated to its final length, the superconductive phase being obtained by a heat treatment including a solid state diffusion reaction.

Thus an inventive composite can be used in a method based upon the bronze route to produce superconductive elements of $Nb_3Sn$ with a tailored Cu content, allowing optimized, i.e. maximized critical current densities.

In a variant of the inventive method, at least part of the cold or hot working and annealing steps are preceded by an intermediate annealing between 520 and 750° C., and by a fast cooling within less than 30 s to 100° C. or below (="Rapid Intermediate Quenching"). The annealing temperature is above the normal Cu—Sn recrystallization temperature. With rapid intermediate quenching, a high critical temperature $T_c$ and a high upper critical magnetic field strength $B_{c2}$ for the superconducting element can be obtained.

In an alternative variant of the inventive method, at least part of the deforming steps are performed by isothermal hot rolling in a temperature region between 520° C. and 750° C. Again, this temperature is above the recrystallization temperature of the Cu—Sn bronze matrix. Again, in this way a high critical temperature $T_c$ and a high upper critical magnetic field strength $B_{c2}$ for the superconducting element can be obtained.

Further within the scope of the invention is a superconductive element, in particular a multifilament wire, produced by the bronze route based on the bronze diffusion process, comprising filaments containing $Nb_3Sn$, characterized in that the filaments contain between 0.3% and 30% of volume of copper (=Cu). With the bronze route known from the state of the art, the filaments containing $Nb_3Sn$ only contain small amounts of copper, i.e. less than 0.2 vol. %. The high Cu contents of a bronze route produced superconductive element can only be obtained by using an inventive composite as described above. Thus, the use of the invention can be recognized at a superconducting element by the characteristics caused by the bronze route and a high copper content. The high copper content makes high critical current densities available for the superconducting element.

In a preferred embodiment of the inventive superconducting element, the filaments contain less than 10% of volume of Cu, in particular about 2% of volume of Cu. These values grant high critical current density values.

In another preferred embodiment of the inventive superconducting element, the filaments have a diameter between 1 μm and 10 μm, in particular between 2 μm and 6 μm, preferably about 5 μm. These parameters have proved themselves in practice.

Further preferred is an embodiment of the inventive superconductive element, characterized in that it is produced by an inventive method as described above.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
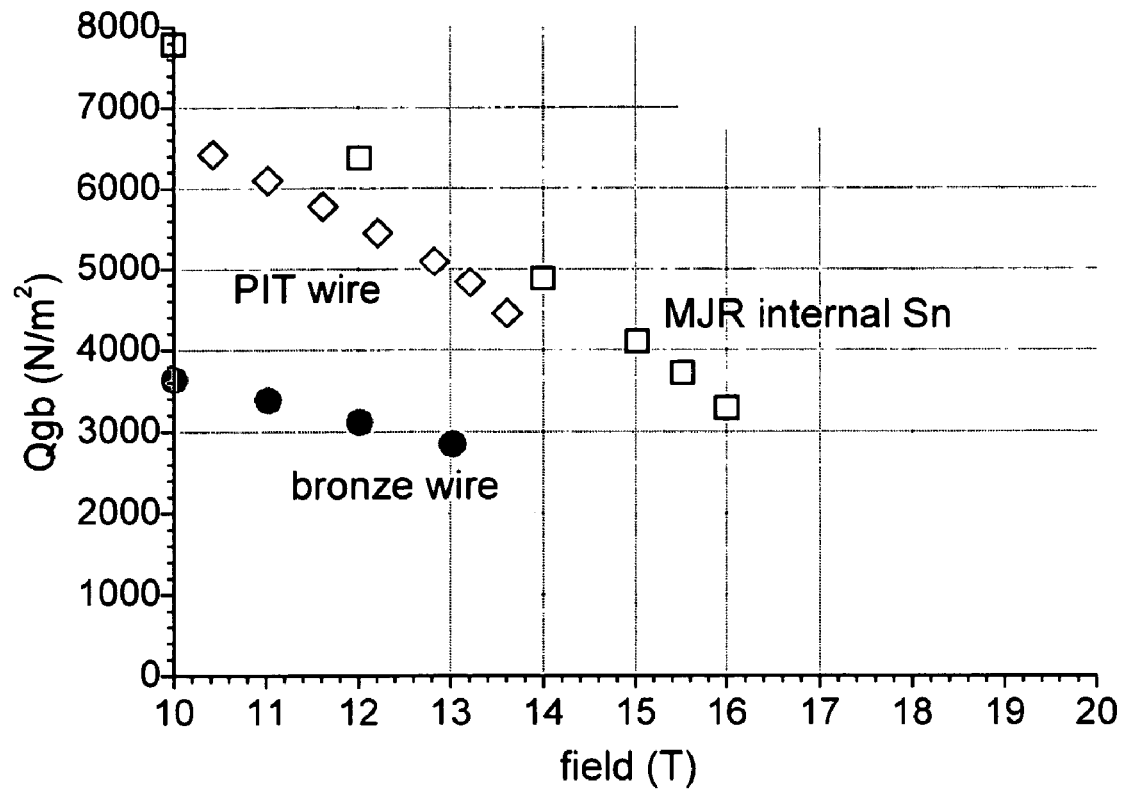
FIG. 1 shows a diagram plotting the specific grain boundary pinning force of $Nb_3Sn$ wires produced by ISD, PIT and bronze route as known from the state of the art, after D. Larbalastier et al. [4]

Production of $Nb_3Sn$ Material by the Bronze Route in the State of the Art

Superconductive $Nb_3Sn$ wires are typically produced either by the powder in tube (PIT) process, by the Internal Sn Diffusion (ISD) method or by the bronze route.

In the bronze route, a number of niobium (Nb) or niobium-tantalum (NbTa) rods are inserted into a bronze matrix containing mainly copper (Cu) and tin (Sn) and small amounts of titanium (Ti). By repeated extruding, bundling and insertion into further bronze cans, a ductile wire or composite with numerous Nb or NbTa fibers or filaments embedded in a bronze matrix is obtained. In order to improve the thermal conductivity, some pure copper is also introduced into the wire, separated from the Cu—Sn bronze by a Ta barrier to avoid contamination during the reaction heat treatment.

The wire is then brought into the desired shape, e.g. by winding the wire into a coil. Subsequently, the wire is annealed at a temperature of about 600-700° C. During this solid state diffusion reaction, Sn originating form the Cu—Sn bronze diffuses into the Nb or the NbTa fibers and forms $Nb_3Sn$, which is superconductive at a transition temperature of 18 K at the stoichiometric composition. The $Nb_3Sn$ phase is also called A15 phase.

Typically, the Nb or NbTa fibers do not completely react to $Nb_3Sn$, but some Nb (or NbTa) remains unreacted at the center of the filaments. Within the $Nb_3Sn$ phase, a concentration gradient yields, varying from 25 at. % Sn at the interface with the bronze matrix to 17% Sn content near the unreacted central Nb or NbTa core [1].

The $Nb_3Sn$ phase with low Sn contents exhibits inferior superconductive properties, with $T_c$=6 K and $B_{c2}$=7 T. Therefore, high and homogeneous Sn contents in the $Nb_3Sn$ phase are desired. The Sn content in the $Nb_3Sn$ phase can be increased by increasing the annealing temperature (=reaction temperature) and/or the annealing time (=reaction time). However, this also induces enhanced grain growth, which deteriorates the current carrying properties of the filament again. Thus, the maximum value of critical current density is achieved by an optimization where the two parameters, temperature and time, are varied.

SCIENTIFIC BACKGROUND OF THE INVENTION

The behavior of the critical current density ($J_c$) of $Nb_3Sn$ wires at given values of temperature (T) and magnetic field (B) is influenced by both flux pinning and the upper critical magnetic field ($Bc_2$).

Upper critical field $B_{c2}$. The value of the upper critical magnetic field $B_{c2}$ of $Nb_3Sn$ is influenced by the electronic mean free path, which in turn depends on $\rho_o$, the value of the electrical resistivity just above the superconducting transition temperature $T_c$. The enhancement of $\rho_o$ and thus of $B_{c2}$ has been successfully achieved by various authors since 1980. After alloying with Ta and/or Ti, the value of $B_{c2}$ at 4.2 K was found to increase from 20 T, the value for binary $Nb_3Sn$, to 26 T [2].

Flux pinning. The effect of flux pinning has been recognized as being correlated to the density of dislocations at the $Nb_3$ Sn grain boundaries. It is well documented that smaller grains correspond to higher values of $J_c$ and thus to higher values of the Lorentz pinning force, $F_p = J_c \times B$, where B is the applied magnetic field. As an example, the grain sizes of 200, 85 and 40 nm correspond to the Lorentz force $F_p$=2.5, 5.1 and $6.8 \times 10^{10}$ $Nm^{-3}$, respectively [3].

The combined effect of flux pinning and electronic mean free path has been repeatedly confirmed and is in principle quite well understood. However, a comparison of the variation of $J_c$ vs. B between various types of $Nb_3Sn$ wires shows substantial differences. The specific grain boundary pinning ($Q_{gb}$) for $Nb_3Sn$ wires prepared using the three techniques Internal Sn Diffusion, Powder-In-Tube and Bronze Route is shown in FIG. 1 as a function of the applied magnetic field [4]. It shows a much smaller increase for bronze route wires compared to Internal Sn Diffusion and PIT wires towards smaller values of the magnetic field. A plot of the corresponding values of $J_c$ as a function of the applied magnetic field B shows that the extrapolated value of $J_c$ at high fields is of the same order of magnitude for all wire types, corresponding to similar values of $B_{c2}$ [5]. Thus, the reason for the strong differences at lower fields (FIG. 1) can only arise from the particular conditions at the grain boundaries.

Typically, the thickness of the superconducting layer in commercial bronze route $Nb_3Sn$ wires is about 1-2 μm, with grains sizes between 80 nm and 150 nm) [2]. There are only a few reports where the microstructure at the grain boundaries has been discussed in detail. By means of Auger electron spectroscopy (AES), an accumulation of Cu at the grain boundaries (up to 1.5 at % [6]) has been observed in bronze route processed $Nb_3Sn$ wires. It is well known that the additives Ti and Ta substitute Nb in the $Nb_3Sn$ crystal structure, thus leading to the increase of $B_{c2}$. This situation is strongly different for Cu, which turns out to be almost completely insoluble in $Nb_3Sn$, being thus exclusively located at the grain boundaries, in contrast to Ti. Rodrigues [7] have analyzed the chemical composition at the grain boundaries, by means of TEM microscopy on binary and alloyed $Nb_3Sn$ commercial wires, with a resolution of about 2 nm. Their results suggest that Cu is present at the grain boundaries only. This has been confirmed on our samples, where the grain boundaries in 20 nm thick lamellae have been analyzed by Electron Energy Loss Spectroscopy (EELS).

Figure 2:
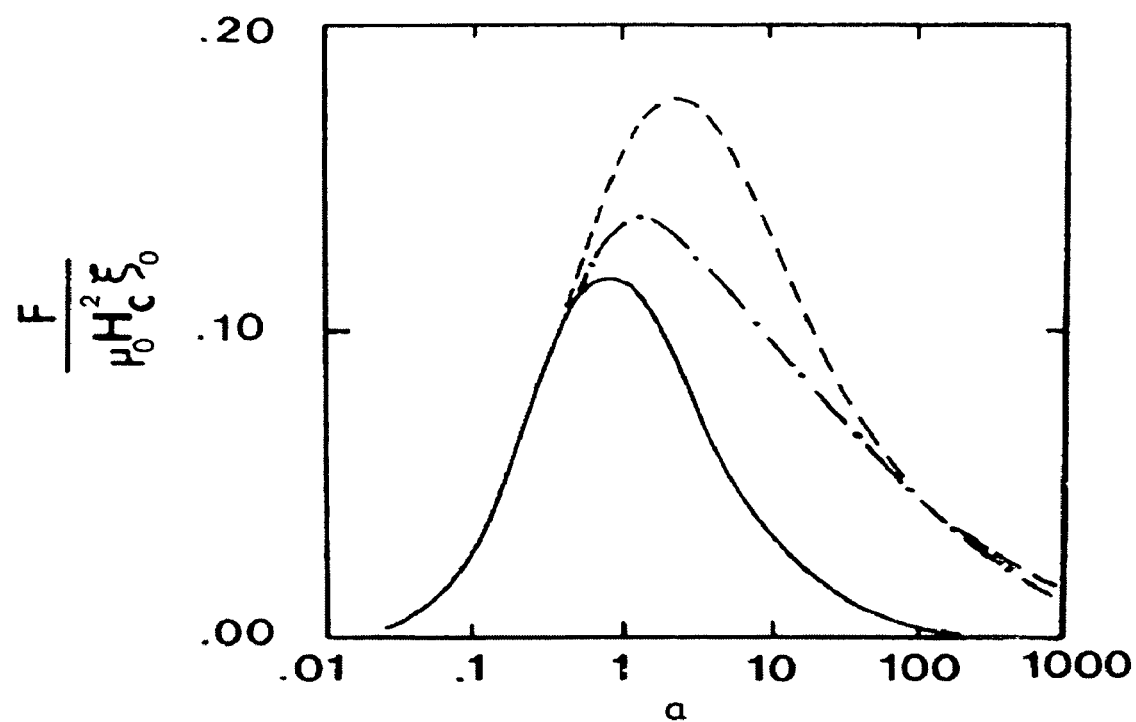
FIG. 2 shows a diagram plotting the specific pinning force in Pb/Bi films versus the impurity parameter a, for three grain boundary widths, after D. Welch [9]

The relation between grain boundary width and flux pinning has been studied by Yetter [8] who established a correlation between $J_c$ (thus the pinning force $F_p$) and the grain boundary width of Pb/Bi thin films. This result is in qualitative agreement with the theoretical prediction of Welch [9]: the pinning force $F_p$ is low for very narrow grain boundary widths, but increases with the boundary widths up to a maximum $F_p$(max). Further widening of the grain boundary width leads to a decrease of $F_p$, as shown in FIG. 2, where the specific pinning force is plotted as a function of the impurity parameter $\alpha = 0.882 \xi_0 / l_\theta$, the ratio between the coherence length $\xi_0$ and the electron mean free path $l_\theta$. The specific pinning force as a function of the grain boundary width presents a maximum at 1.5 times the coherence length (dashed curve). For wider or smaller grain boundaries (dash-dot and solid curves), the pinning force, and thus the critical current, will be reduced.

Rodrigues et al. [8] showed that in the alloyed wire (Nb, Ti,Ta)$_3$Sn the composition of the additives Ta and especially Ti across the grain boundary exhibits a local change over a wider range than for Nb and Sn. However, it is important to note that the alloying of Ta and/or Ti leads to higher JC for high fields only (B>18 T), where $B_{c2}$ becomes more and more dominant.

In view of applications at intermediate fields, i.e. from 12 to 16 T, where the effect of the grain boundaries is dominant, it is important to optimize the amount of Cu at the grain boundary region. In other words, the conditions at the boundary corresponding to a maximum $J_c$ value has to be found experimentally by optimizing the Cu content at the grain boundaries. This is only possible if the variation of the Cu content can be controlled during the fabrication process. This question can only be answered by comparing the $Nb_3Sn$ formation mechanism for each fabrication technique, recalling that the presence of a certain amount of Cu is an imperative condition for the formation of the $Nb_3Sn$ phase in the temperature range of 600-700° C. Without Cu, the formation temperature of $Nb_3Sn$ is much higher, around 900° C. It follows that the $Nb_3Sn$ formation conditions for both the ISD and the PIT techniques not only allow considerably larger amounts of Sn and Cu than for the bronze route, but that the corresponding compositions can be varied independently, thus allowing to reach the optimum conditions for a maximum $J_c$ value. As a consequence, high amounts of Sn and thus of Nb can be introduced, resulting in larger $Nb_3Sn$ contents with respect to conventional bronze route wires.

The situation is completely different for conventional bronze route wires, where both the Sn and the Cu content are correlated by the solubility limit of Sn in the Cu—Sn bronze, i.e. close to 15.6 wt. % Sn. In addition, the source of Cu required for the formation of the $Nb_3Sn$ phase is located in the Cu—Sn bronze outside of the filament: the presence of Cu at the $Nb_3Sn$ formation front inside the filament is due to the simultaneous migration of a certain amount of Sn and Cu (<2 wt. %) from the Cu—Sn bronze to the Nb or NbTa core. In the following it is shown how the amount of Cu at the A15 grain boundaries in bronze route $Nb_3Sn$ wires can be introduced in a controlled way.

Inventive Modification of the Bronze Route

Bronze route wires with optimal Cu doping and enhanced flux pinning can be made by introducing up to 20 vol. % Cu, preferably up to about 10 wt. % Cu, inside of the Nb or NbTa filaments. Cu is neither soluble in Nb nor in NbTa, but a series of ways are proposed for getting an uniform Cu distribution in a wire starting from commercially available bronzes with the compositions, Cu-15.6 wt. % Sn, Cu-15.6 wt. % Sn-0.25 wt. % Ti or Cu-5.6 wt. % Sn-0.5 wt. % Ti, the corresponding Nb or NbTa content being 25 to 28 wt. %. The present invention can also be applied to higher Sn contents, up to 24 wt. %, which can only be deformed using particular deformation procedures, described in the pending European patent applications 04021982.6 and 04021983.4.

In the following, some methods to introduce Cu inclusions are described.

1: Cu inclusions (nano-inclusions) of thicknesses between 50 and 500 nm will be introduced by adding Cu cores in a Nb or NbTa rod. This is performed by a supplementary extrusion step at the beginning of the fabrication process. The number of Cu cores can vary from 1 to 19, but 37 are also possible. The additional extrusion step induces a strong enhancement of the reduction ratio, by a factor of >50, in order that at the of the deformation process, the size of both, Cu core thickness and Nb thickness between Cu inclusions will be close to that of the coherence length $\xi_0$. The reduction of Cu inclusions in a Cu/Nb composite to such fine dimensions has been demonstrated by Bevk [10] and Eagar [11]. In the present case, the Cu content inside the Nb or NbTa rods will vary from 0.1 to 10 wt. %. This low Cu content is chosen in order to maintain the superconducting part of the filament cross section as large as possible. In addition, it will decrease proximity effects.

2: The use of mechanically reinforced Cu—Nb tubes as filaments for the Bronze Route has been described in pending European patent application 04004605.4 for enhancing the amount of stoichiometric $Nb_3Sn$ bronze core. In analogy to point 1, Cu inclusions (nano-inclusions) of thicknesses between 50 and 500 nm will be introduced by adding mixed CuNb cores in a Nb or NbTa tube, containing a central Cu—Sn. The final dimension of the Cu inclusions as well as their content in the Nb or NbTa tube is the same as in point 1.

3: Cu inclusions are introduced in the filaments by powder metallurgy [12], starting with mixtures of Nb and Cu powders with sizes between 40 and 200 microns. This process has the advantage to avoid the first extrusion step, but a particular care has to be given to minimize the oxygen absorbed at the powder surfaces. Oxygen may migrate into the Nb or NbTa during the intermediate anneals, resulting in hardening and in difficult deformation.

4: Cu inclusions are introduced by in situ melting [13] of Nb—Cu alloys containing up to 10 wt. % Cu. The original dendrite sizes are of the order of 100 microns, depending on the cooling rate. This process has the advantage to avoid the first extrusion step. In addition, less oxygen is introduced during the melting procedure when compared to fine powders.

Points 1 to 4 describe the introduction of Cu for improving the variation of $J_c$ in the intermediate magnetic field range. It is important that the Cu content does not exceed a maximum value, in order to maximize the amount of $Nb_3Sn$ in the reacted wire. Recently, Rodrigues et al [14] published the preparation of Cu—Nb superconducting composite wires with the Nb dimensions in the nanometric range. They also report how these composites were used to produce $Nb_3Sn$ wires, but did not give any data about the critical current densities, invoking proximity effects. However, their situation is completely different from the present one: in our case, the Cu content of the NbCu initial rods should not exceed 20 vol. %, while Rodriguez et al. [14] used Cu contents as high as 64 wt. %. The proximity effects linked to this excessively high Cu content are thus a major problem, in contrast to the present case.

Figure 3:
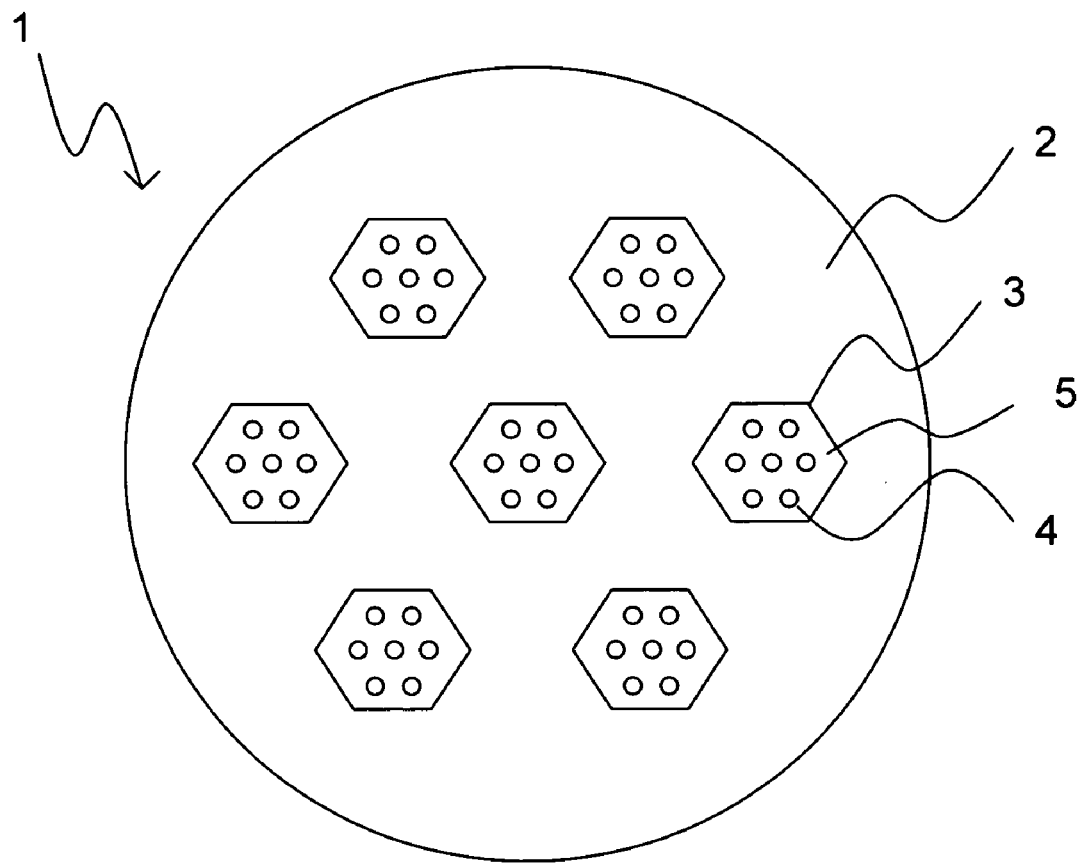
FIG. 3 shows schematically in a cross-sectional view an inventive composite for producing a superconducting element, in accordance with the invention.

FIG. 3 shows a composite 1 for producing a superconductive element in accordance with the invention. The composite 1 comprises a Cu—Sn bronze matrix 2 containing some filaments 3. These filaments 3 consist substantially of Nb or a Nb alloy; the Nb or Nb alloy forms a filament matrix 5 for copper substructures 4 which are embedded within the filament matrix 5.

The composite 1 may be used to produce a superconducting element, in particular a wire of a superconducting magnetic coil, with $Nb_3Sn$ being the superconductor material. For this purpose, the composite is annealed at temperatures of typically 600-730° C. Before, it is possible to bundle and elongate composites 1 in order to obtain more superconducting filaments in the final superconducting element. During the final annealing, the Cu from the copper substructures 4 gets into the freshly forming $Nb_3Sn$ material, i.e. its grain boundaries, and a desired Cu content optimized for the critical current density of the $Nb_3Sn$ material can be obtained.

Figure 4:
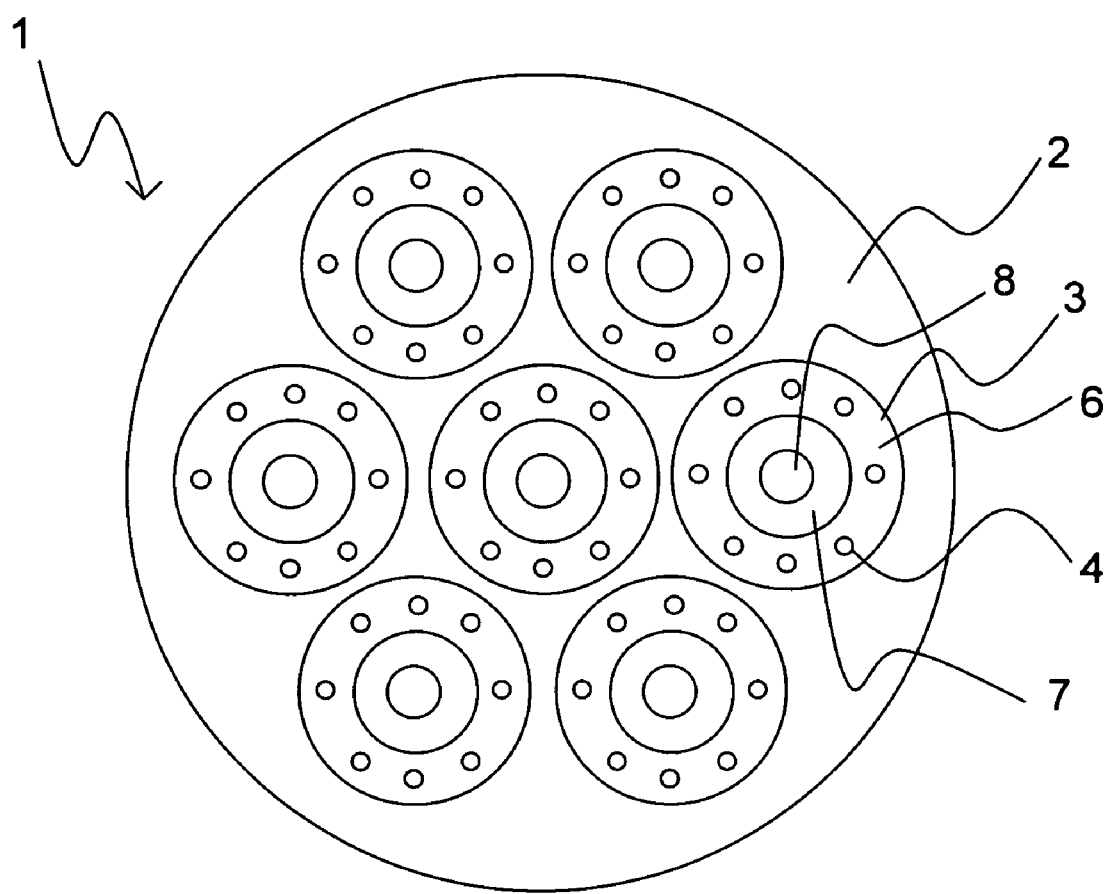
FIG. 4 shows, in a schematic cross-sectional view, another composite for producing a superconductive element in accordance with the invention.

FIG. 4 shows, in a schematic cross-sectional view, another composite 1 for producing a superconductive element in accordance with the invention. The composite 1 comprises a Cu—Sn matrix 2 containing some filaments 3, in the example shown seven filaments 3.

A filament 3 has the shape of an elongated hollow pipe 6; here the pipe shape is round on the inner and outer side and only the ring-shaped cross-section is visible in the figure. Note that other pipe shapes, such as a rectangular shape on the inner and outer side, are possible. The hollow pipe 6, and thus the filament 3, is made of Nb or a Nb containing alloy and acts as a matrix for incorporated copper substructures 4. In the example shown, the Cu substructures 4 are eight copper threads. The Cu substructures 4 are only in contact with the hollow pipe 6.

Within the hollow pipe 6, there is an inner bronze core 7 made substantially of Cu and Sn. The inner bronze core 7, in turn, surrounds a core 8 of Ta or a Ta alloy, such as a Ta thread. In the example shown, the core 8 is round in cross-section; note that again other shapes of the core 8, such as a rectangular cross-section, are possible.

The Sn contained in the surrounding bronze matrix 2 and the inner bronze core 7 has short diffusion paths to the Nb contained in the hollow pipe 6. In more detail, Sn can diffuse directly into the filament 3 through the outer surface (i.e. from the surrounding matrix 2 into the neighbouring hollow pipe 6), or through the inner surface (i.e. form the inner bronze core 7 into the neighbouring hollow pipe 6). This accelerates the formation of the wanted superconductive $Nb_3Sn$ material; it may form on two sides. The copper of the Cu substructures 4, which are located within the hollow pipe 6, is not blocked by $Nb_3Sn$ formed at the interface of the hollow pipe 6 and the surrounding bronze matrix 2 or the inner bronze core 7. The core 8 of Ta or a Ta containing alloy supplies Tantalum to the Nb$_3$Sn phase, which increases the B$_{c2}$ value of the superconductive phase. The Ta is placed near the location where it is needed, thus relatively low amounts of Ta in the composite 1 are sufficient.

In summary, the invention provides a superconductive element containing Nb$_3$Sn, in particular a multifilament wire, comprising at least one superconductive filament which is obtained by a solid state diffusion reaction from a preliminary filament structure, consisting of Nb or Nb alloys, in particular NbTa, containing elongated Cu inclusions at their inside, finely distributed over the whole filament volume, obtained by at least one extrusion step, wherein the Nb or NbTa surface is in close contact with a surrounding bronze matrix containing Cu and Sn.

REFERENCES

1 M. Klemm et al., *Supercond. Sci Technol.*, 3, 249-254 (1990)
2 K. Tachikawa, in <<Filamentary A15 superconductors>>, Ed. M. Suenaga and A. F. Clark, Cryogenic Material Series, 1980, p. 1-16.
3 W. Schauer and W. Schelb, "Improvement of Nb$_3$Sn High Field Critical Current by a Two Stage Treatment", IEEE Trans. Magn., MAG-17, 374 (1981),
4 D. Larbalestier et al., IEEE Trans. Appl. Supercond., 13, 3422-3425 (2003)
5 D. Uglietti et al., ASC 2004, to be published in IEEE Trans. Appl. Supercond.
6 D. B. Smathers and D. Larbalestier, Adv. Cryo. Engrg., 28, 415-423 (1982)
7 D. Rodrigues et al., *IEEE Trans. Appl. Supercond.*, 5, 1607-1610 (1995)
8 W. E. Yetter et al., *Phil. Mag. B*, 48, 1-12 (1983)
9 O. Welch, *IEEE Trans. on Mag.*, MAG-21, 827-830 (1985)
10 J. Bevk, "Ultrafine Filamentary Composites", Annual Rev. of Materials Science, Vol. 13 (1993) 319-338
11 T. W. Eagar, *IEEE Trans. Nucl. Sci.*, 20, 742 (1973)
12 R. Flükiger et al., "High Jc in cold-powder metallurgy processed superconducing Cu—Nb composites", Appl. Phys. Let., 34 (1979) 763-766
13 R. Roberge, S. Foner, E. J. McNiff, Jr., B. B. Schwartz, "Improvement of "in situ" multifilamentary Nb3Sn superconducting wires", Appl. Phys. Lett., 34 (1979) 111
14 D. Rodrigues et al., presented at ASC 2004

We claim:

1. A composite for producing a superconductive element, the composite comprising:
    filaments containing niobium (=Nb) or a Nb alloy;
    a Cu—Sn bronze matrix surrounding the filaments; and 0.3% and 20% volume of copper (=Cu) substructures distributed within said Nb or said Nb alloy, wherein said Nb or Nb alloy containing filaments have a shape of an elongated hollow pipe, an inner surface of said hollow pipe being in close contact with an inner bronze core and an outer surface of said hollow pipe being in close contact with a surrounding bronze matrix, said inner bronze core containing a core of Ta or Ta alloy, wherein said Cu substructures have a size between 5 and 100 nm.

2. The composite of claim 1, wherein said filaments contain less than 10% of volume of said Cu substructures or about 1% of said volume of said Cu substructures.

3. The composite of claim 1, wherein said Cu substructures contain elemental copper or consist essentially of elemental copper with a purity of at least 98% of volume or with a purity of at least 99.8% of volume.

4. The composite of claim 1, wherein said filaments contain at least 70% of volume of Nb or Nb alloy, at least 90% of volume of Nb or Nb alloy, or about 98% of volume of Nb or Nb alloy.

5. The composite of claim 1, wherein said filaments are directly embedded within said bronze matrix.

6. The composite of claim 1, wherein said filaments or groups of said filaments are contained within a copper shell or a copper shell for each group of filaments, wherein said copper shell is disposed within said bronze matrix.

7. The composite of claim 1, wherein said Cu substructures are evenly distributed within said Nb or said Nb alloy or said Cu substructures are powder particles distributed Within Nb or Nb alloy powder particles.

8. The composite of claim 1, wherein said Cu substructures comprise Cu threads.

9. The composite of claim 8, wherein said Cu threads have a diameter of about 20 to 50 nm.

10. The composite of claim 1, wherein said filaments have a diameter between 1 μm and 10 μm, between 2 μm and 6 μm, or of about 5 μm.

11. The composite of claim 1, wherein said Cu—Sn bronze contains between 15 and 24 wt. % Sn.

12. The composite of claim', wherein said filaments comprise Nb$_3$Sn.

13. A method for producing a superconductive element or multifilament wire, using the composite of claim 1, the method comprising the steps of:
    a) extruding the composite at a temperature between 300° C. and 750° C.;
    b) elongating the composite parallel to the filaments while softening the composite using temperature treatment having cold or hot working and annealing steps;
    c) stacking and bundling a multitude of composites elongated in step b) via the cold or hot working steps;
    d) repeating steps a), b), and c) one or more times; and
    e) elongating the composite with intermediate annealing processes to a final length thereof, wherein a superconductive phase is obtained by a heat treatment including a solid state diffusion reaction.

14. The method of claim 13, wherein at least part of the cold or hot working and annealing steps are preceded by an intermediate annealing between 520 and 750° C. and by a fast cooling within less than 30 s to 100° C. or below (="Rapid Intermediate Quenching").

15. The method of claim 13, wherein at least part of deforming steps are performed by isothermal hot rolling in a temperature region between 520° C. and 750° C.

16. The superconductive element produced by the method of claim 13.

* * * * *